United States Patent
Maurino et al.

(10) Patent No.: US 11,967,972 B2
(45) Date of Patent: Apr. 23, 2024

(54) SPREAD SPECTRUM CHOPPING FOR SIGMA DELTA MODULATORS

(71) Applicant: Analog Devices International Unlimited Company, Limerick (IE)

(72) Inventors: Roberto Sergio Matteo Maurino, Turin (IT); Bhargav R. Vyas, Bangalore (IN); Ayesha Shaik, Bangalore (IN)

(73) Assignee: Analog Devices International Unlimited Company, Limerick (IE)

(*) Notice: Subject to any disclaimer, the term of this patent is extended or adjusted under 35 U.S.C. 154(b) by 0 days.

(21) Appl. No.: 17/735,740

(22) Filed: May 3, 2022

(65) Prior Publication Data
US 2023/0361784 A1 Nov. 9, 2023

(51) Int. Cl.
*H03M 3/00* (2006.01)

(52) U.S. Cl.
CPC .................... *H03M 3/498* (2013.01)

(58) Field of Classification Search
CPC .................................................. H03M 3/498
See application file for complete search history.

(56) References Cited

U.S. PATENT DOCUMENTS

| | | | | |
|---|---|---|---|---|
| 5,459,432 A * | 10/1995 | White | ...................... | H03D 1/00 375/321 |
| 5,732,003 A * | 3/1998 | White | ................ | H03H 17/0219 708/320 |
| 5,764,705 A * | 6/1998 | White | ................. | H04L 27/3854 329/304 |
| 5,808,924 A * | 9/1998 | White | ................ | H03H 17/0416 708/320 |
| 5,960,091 A * | 9/1999 | White | ............... | H03H 17/0288 381/98 |
| 6,130,578 A | 10/2000 | Tang | | |
| 7,295,140 B2 * | 11/2007 | Chuang | ................... | H03M 3/34 341/143 |
| 8,779,958 B1 * | 7/2014 | Maurino | ................. | H03M 3/35 341/144 |
| 9,294,037 B2 * | 3/2016 | Maurino | ............... | H03F 1/0277 |
| 9,800,262 B1 * | 10/2017 | Maurino | ................ | H03M 1/08 |
| 9,859,907 B1 * | 1/2018 | Li | ...................... | H03M 1/0678 |
| 10,733,391 B1 * | 8/2020 | Sánchez | ................. | H03M 3/356 |
| 11,251,807 B1 * | 2/2022 | Ren | ...................... | H03M 3/458 |
| 2004/0140922 A1 * | 7/2004 | Melanson | ............. | H03M 3/344 341/143 |

(Continued)

OTHER PUBLICATIONS

Li, Li, et al., "A 24-bit sigma-delta ADC with configurable chopping scheme", IEICE Electronics Express, 16(10), (2019), 6 pgs.

(Continued)

*Primary Examiner* — Lam T Mai
(74) *Attorney, Agent, or Firm* — Schwegman Lundberg & Woessner, P.A.

(57) ABSTRACT

Chopping techniques that suppress fold-back into the signal band and spreads the offset across the spectrum are described. By using various techniques, chopping may be performed with a variable frequency clock to spread the offset across the signal spectrum. Spreading the offset across the signal spectrum means that there are no longer large spurious tones at a few frequencies.

20 Claims, 6 Drawing Sheets

(56) References Cited

U.S. PATENT DOCUMENTS

2005/0156769 A1* 7/2005 O'Dowd .................. H03M 3/34
341/143
2016/0248455 A1* 8/2016 Dhanasekaran ..... H04B 1/0475

OTHER PUBLICATIONS

Wang, Chris Binan, "A 20-bit 25-kHz Delta-Sigma A/D Converter Utilizing a Frequency-Shaped Chopper Stabilization Scheme", IEEE Journal of Solid-State Curcuits, 36(3), (Mar. 2001), 566-569.

* cited by examiner

SPREAD SPECTRUM CHOPPING FOR SIGMA DELTA MODULATORS

FIELD OF THE DISCLOSURE

This document pertains generally, but not by way of limitation, to integrated circuits, and more particularly, to analog to digital converter circuits and systems.

BACKGROUND

In many electronics applications, an analog input signal is converted to a digital output signal (e.g., for further digital signal processing). For instance, in precision measurement systems, electronics can be provided with one or more sensors to make measurements, and these sensors can generate an analog signal. The analog signal can then be provided to an analog-to-digital converter (ADC) as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

A difference between the input voltage and the output voltage of the ADC can correspond to the quantization error of the ADC. In some ADCs, the quantization error can be further processed by ADC circuitry to "shape" the quantization error, which appears as quantization noise in the frequency domain. Noise shaping techniques can push the quantization noise away from the signal band of interest and into higher frequencies, for example.

A sigma-delta modulator is a feedback system that can achieve high-resolution digital signals. Sigma-delta modulators have been implemented in a wide variety of electronic circuits, including but not limited to, analog-to-digital converters (ADCs), digital-to-analog converters (DACs), frequency synthesizers, and other electronic circuits.

ADCs based on sigma-delta modulation have been widely used in digital audio and high precision instrumentation systems. Typically, a sigma-delta ADC encodes an analog signal using a sigma-delta modulator (e.g., using a low-resolution ADC such as a 1-bit ADC, Flash ADC, Flash quantizer, etc.) and then, if applicable, applies a digital filter to the output of the sigma-delta modulator to form a higher-resolution digital output. A loop filter can be provided to provide error feedback to the sigma-delta modulator. One characteristic of a sigma-delta modulator is its noise shaping capability. As a result, sigma-delta ADCs are generally able to achieve high resolution analog-to-digital conversion.

SUMMARY OF THE DISCLOSURE

This disclosure describes a chopping technique that suppresses fold-back into the signal band and spreads the offset across the spectrum. By using various techniques of this disclosure, chopping may be performed with a variable frequency clock to spread the offset across the signal spectrum. Spreading the offset across the signal spectrum means that there are no longer large spurious tones at a few frequencies.

In some aspects, this disclosure is directed to an analog-to-digital converter (ADC) circuit to generate a digital output signal, the ADC circuit comprising: an oversampled ADC circuit having an input coupled to receive an analog input signal and generate a first digital output signal, the SD ADC including: a chop switch that receives and is controlled by a variable frequency chop signal; and a chop signal generating circuit to generate the variable frequency chop signal; a sample rate converter circuit to receive the first digital output signal at a first sample rate and generate a second digital output signal at a second sample rate; and a digital filter circuit to process the second digital output signal and generate a filtered digital output signal.

In some aspects, this disclosure is directed to a method of operating an analog-to-digital converter (ADC) circuit to generate a digital output signal, the method comprising: receiving an analog input signal at a summing node of a sigma-delta (SD) ADC circuit, wherein the SD ADC circuit includes an integrator circuit having an amplifier circuit and a chop switch coupled to an input of the amplifier circuit; receiving, using the integrator circuit, an output of the summing node; generating a variable frequency chop signal and operating the chop switch at the variable frequency chop signal; receiving a first digital output signal of the SD ADC circuit at a first sample rate and generating a second digital output signal at a second sample rate; and processing the second digital output signal and generating a filtered digital output signal.

In some aspects, this disclosure is directed to an analog-to-digital converter (ADC) circuit to generate a digital output signal, the ADC circuit comprising: a sigma-delta (SD) ADC circuit having an input coupled to receive an analog input signal and generate a digital output signal, the SD ADC including: an integrator circuit including an amplifier circuit and a chop switch, the chop switch coupled to an input of the amplifier circuit, wherein the chop switch receives and is controlled by a variable frequency chop signal; and means for generating the variable frequency chop signal; and a digital filter circuit to process a representation of the digital output signal and generate a filtered digital output signal.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Chopping the front-end of a modulator is a technique to address offset and flicker noise, such as in precision sigma-delta (SD) modulators. Chopping up-modulates offset and flicker noise to odd multiples of the chopping frequency (Fch), such as Fch, 3Fch, 5Fch, 7Fch . . . . The chopping frequency may be selected such that offset is modulated to out-of-band frequencies and eventually filtered out. As a non-limiting example, a chopping frequency Fch=Fs/32 (192 KHz), which is higher than the signal band (110 KHz), where Fs is the sampling frequency.

To filter out the modulated offset, the notches for Sinc-type digital filters should be present at Fch, 3Fch, 5Fch, 7Fch . . . . But, due to a sample rate converter (SRC) in the signal chain, the notches of the Sinc filter may not always be placed at those frequencies and may result in large undesired fold-back into the signal band.

This disclosure describes a chopping technique that suppresses this fold-back into the signal band and spreads the offset across the spectrum. By using various techniques of this disclosure, chopping may be performed with a variable frequency clock to spread the offset across the signal spectrum. Spreading the offset across the signal spectrum means that there are no longer large spurious tones at a few single frequencies. These techniques may be applied to over-sampled ADC circuits. Oversampling means operating the analog-to-digital converter using a sampling frequency greater than twice the input signal bandwidth and then using a digital filter to reduce the output data rate and filter out high frequency content. Oversampling may help reduce the quantization noise in the bandwidth of interest by spreading its power across a wider frequency and relaxing the requirement on the design of the anti-alias filter. Non-limiting examples of oversampled ADC circuits include, but are not limited to, noise shaping converters, such as sigma-delta ADC circuits and noise shaped successive approximation register (SAR) ADC circuits. Although the techniques of this disclosure are described with specific reference to sigma-delta ADC circuits, the techniques are applicable to any oversampled ADC circuit.

Figure 1:
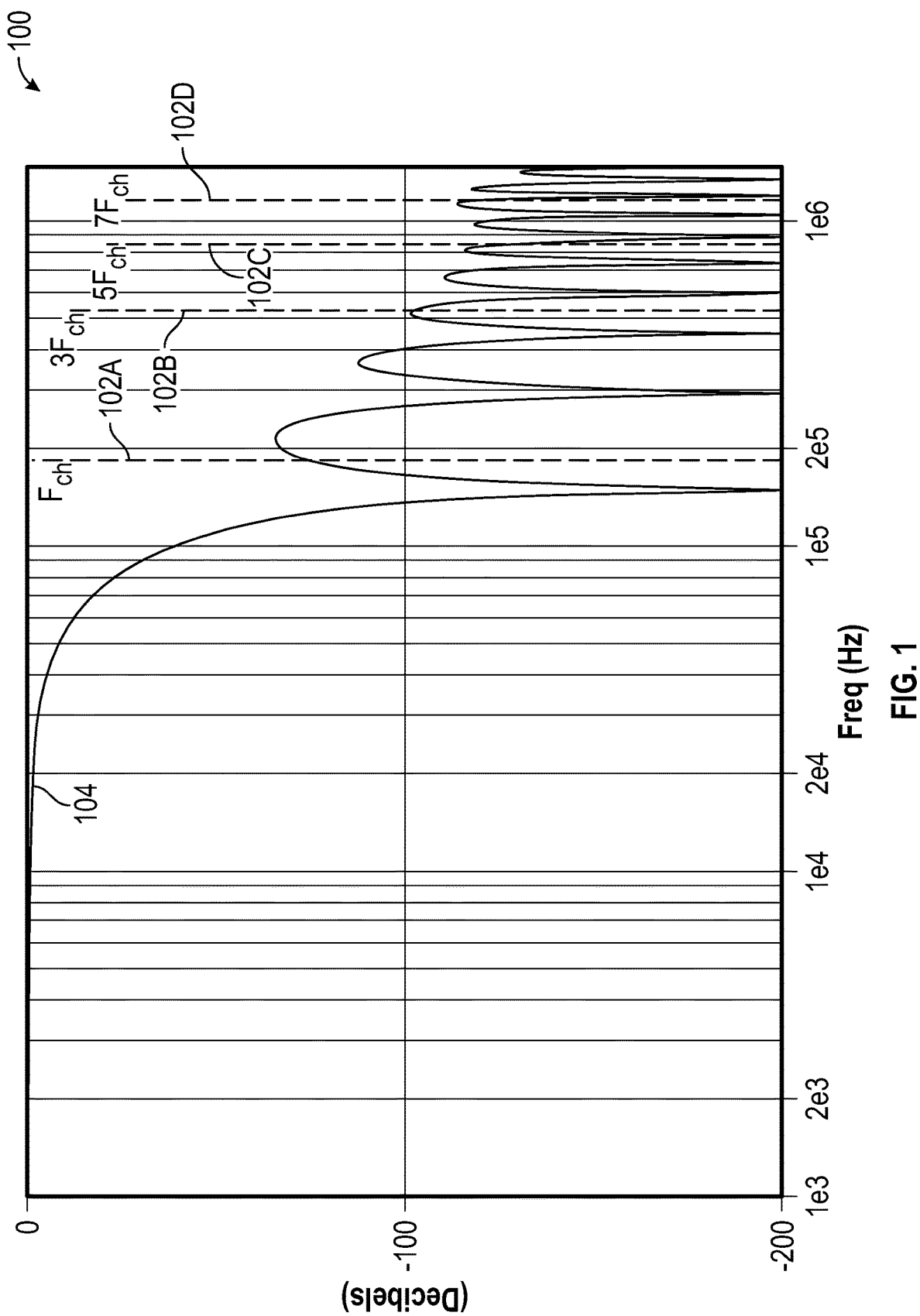
FIG. 1 is a graph depicting an example of a transfer function of a higher order Sinc filter in combination with a sample rate converter overlaid with multiples of a chopping frequency.

FIG. 1 is a graph depicting an example of a transfer function of a higher order Sinc filter in combination with a sample rate converter overlaid with multiples of a chopping frequency. FIG. 1 depicts the modulated offset 102A-102D overlapped with the transfer function 104 of a higher order Sinc filter in combination with a sample rate converter, such as at a 150 KHz output data rate.

As seen in the graph 100 of FIG. 1, the modulated offset 102A-102D do not fall within the notches of the transfer function 104 of the Sinc filter in combination with a sample rate converter. The present inventors have recognized that for SD ADC signal chains that include sample rate conversion and Sinc-type digital filters, the modulated offset due to chopping may result in large undesired fold-back into the signal band.

Although chopping at higher frequencies such as at the sampling frequency Fs or Fs/2 may be used to help reduce the fold-back observed with a Sinc filter in combination with a sample rate converter, there may be disadvantages to chopping at higher frequencies. For example, chopping at higher frequencies may result in higher charge injection, degraded thermal noise, and/or impact the DC offset drift of the chopped integrator.

As described in detail below, by using various techniques of this disclosure, chopping may be performed with a variable frequency clock to spread the offset across the signal spectrum and suppress the fold-back observed with a Sinc filter in combination with a sample rate converter. Spreading the offset across the signal spectrum means that there are no longer large spurious tones at a few single frequencies. Spreading the offset in the in-band lower than the thermal noise floor may satisfy specific signal-to-noise ratio (SNR) requirements. In addition, it may be desirable for the spectrum of the offset to have high pass characteristics.

Figure 2:
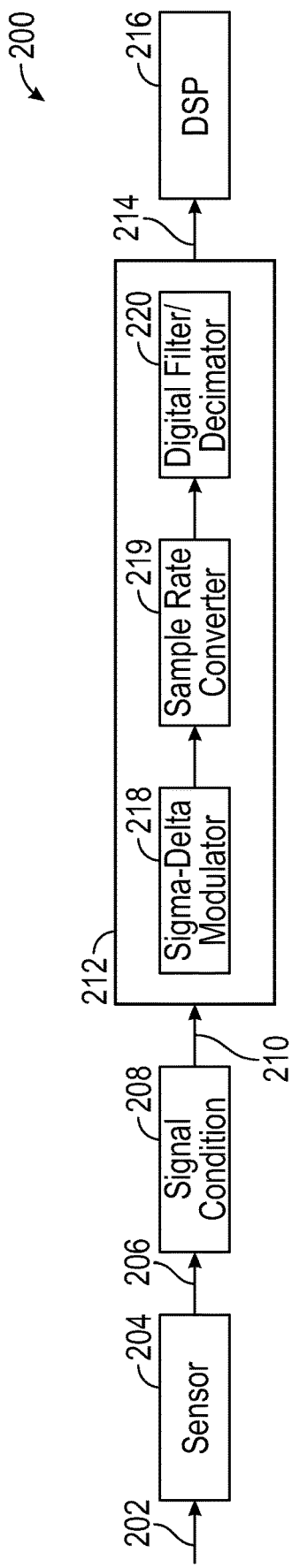
FIG. 2 is a schematic block diagram of an example of a data acquisition system, which can implement a sigma-delta modulator.

FIG. 2 is a schematic block diagram of an example of a data acquisition system 200, which can implement a sigma-delta modulator. The data acquisition system 200 can be an electronic device (including an electronic circuit and/or one or more components) configured to convert signals (such as analog signals) into a usable form. In various implementations, the data acquisition system 200 can convert physical conditions into digital form, which can be stored and/or analyzed. FIG. 2 has been simplified for the sake of clarity. Additional features can be added in the data acquisition system 200, and some of the features described can be replaced or eliminated in other embodiments of the data acquisition system 200.

In FIG. 1, the data acquisition system 200 can include an input signal 202 that represents a physical condition, such as temperature, pressure, velocity, flow rate, position, other physical condition, or combination thereof. A sensor circuit block 204 can receive an input signal 202 and convert the physical condition (represented by input signal 202) into an electrical signal, such as an analog signal 206. The analog signal 206 can be a voltage or current that represents the physical condition (represented by the input signal 202).

A signal conditioning circuit block 208 can receive and adjust the analog signal 206 within an acceptable range of an analog-to-digital converter (ADC), providing a conditioned analog signal 210. The conditioned analog signal 210 can be provided at ADC circuit block 212, such that the signal conditioning circuit block 208 can act as an interface between the sensor circuit block 204 and the ADC circuit block 212, the analog signal 206 (and thus providing the conditioned analog signal 210) before the ADC circuit block 212 digitizes the analog signal. The signal conditioning circuit block 208 can amplify, attenuate, filter, and/or perform other conditioning functions to the analog signal 206. The ADC circuit block 212 can receive and convert the conditioned analog signal 210 into digital form, providing a digital signal 214. The digital signal 214 can represent the physical quantity received by the sensor via the input signal 202. A digital signal processor (DSP) circuit block 216 can receive and process the digital signal 214.

The ADC circuit block 212 can include a sigma-delta ADC that generates a digital signal using a feedback technique, where the sigma-delta ADC can oversample its input signal (here, the conditioned analog signal 210) and perform noise-shaping to achieve a high-resolution digital signal (here, the digital signal 214). The sigma-delta ADC can include a sigma-delta modulator 218, a sample rate converter circuit 219, and a digital filter/decimator 220. The sigma-delta modulator 218 can use oversampling (for example, a sampling rate above Nyquist rate) and filtering to generate a digital signal that represents the input signal received by the sigma-delta ADC (such as the conditioned analog signal 210).

In various implementations, the sigma-delta ADC feedback loop forces the output of the modulator to be a good representation of the input signal in the bandwidth of interest. The digital filter/decimator 220 can attenuate noise and/or slow a data rate (for example, to a Nyquist sampling rate) of the digital signal, providing the digital signal 214. The digital filter/decimator 220 can include a digital filter, a decimator, or both. The digital filter can attenuate the digital signal received from the sigma-delta modulator 218, and the decimator can reduce a sampling rate of the digital signal received from the sigma-delta modulator 218.

Figure 3:
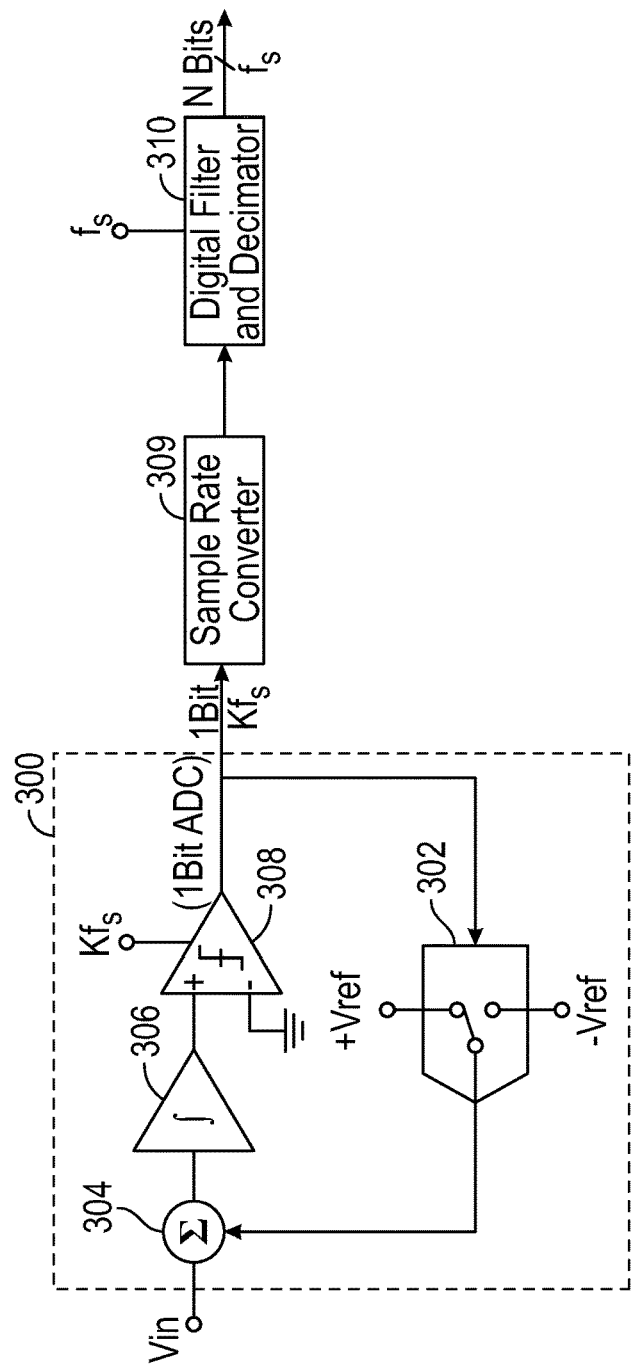
FIG. 3 is a block diagram of an example of a first-order single-bit sigma-delta ADC.

FIG. 3 is a block diagram of an example of a first-order single-bit sigma-delta ADC. The sigma-delta modulator 300 can be an example of the sigma-delta modulator 218 of FIG. 2. The sigma-delta modulator 300 can convert an input signal (Vin) into a continuous serial stream of ones and zeros at a rate determined by a sampling clock frequency Kfs. A one-bit digital-to-analog converter (DAC) 302 can be driven by the serial output data stream to generate a feedback signal. The output of the digital-to-analog converter (DAC) 302 can be subtracted from the input signal using a summing element 304. The summing element 304 can be implemented as the summing node of an operational amplifier (op amp), such as the op amp of an integrator 306.

The integrator 306 can integrate the output of summing element 304, and the output of the integrator 306 can be applied to a clocked latched comparator 308. For an input signal of zero, the comparator output can include an approximately equal number of ones and zeros. For a positive input voltage, the comparator output contains more ones than zeros. For a negative input voltage, the comparator output contains more zeros than ones. The average value of the comparator output over a number of cycles represents the input voltage. The comparator output can be applied to a sample rate converter circuit 309 the output of which being applied to a digital filter and decimator 310 that averages every M cycles, where M is a positive integer greater than 1. The digital filter and decimator 310 can be an example of the digital filter/decimator 220 of FIG. 2. The decimator reduces the effective sampling rate at the output to the sampling rate fs. Additional information may be found in U.S. Pat. No. 9,893,877 to Anvekar et al. and titled "Circuits, systems, and methods for synchronization of sampling and sample rate setting," the entire contents of which being incorporated herein by reference.

Figure 4:
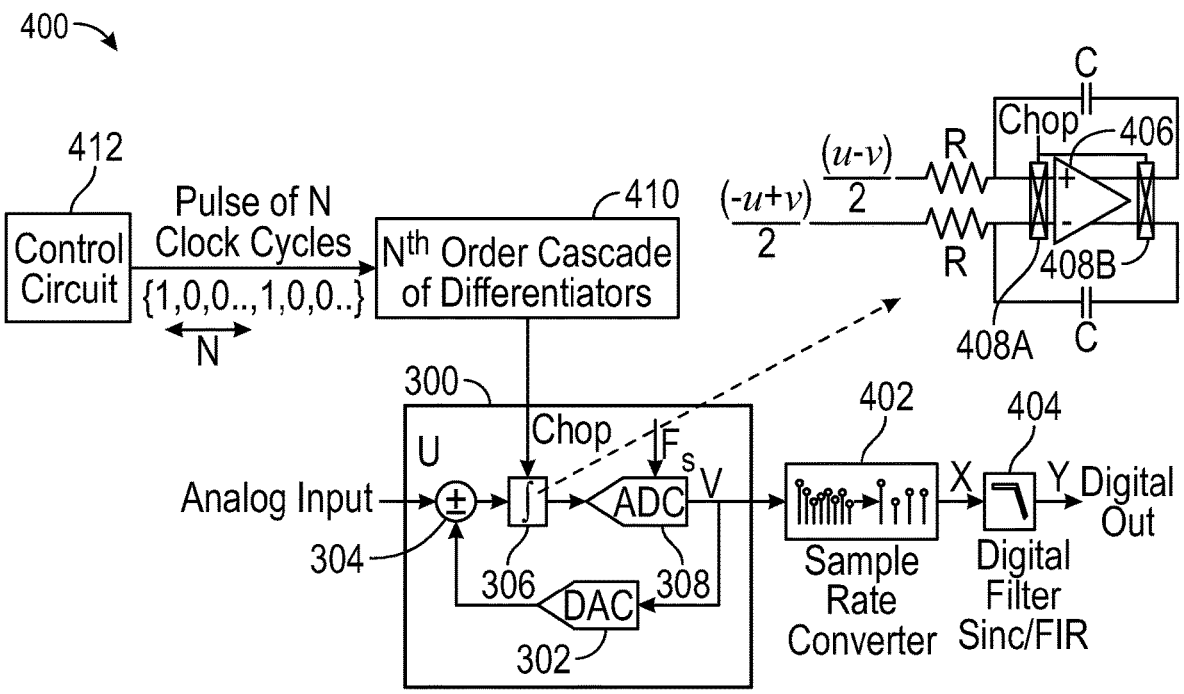
FIG. 4 is an example of an oversampled analog-to-digital converter (ADC) circuit that may implement various techniques of this disclosure.

FIG. 4 is an example of an oversampled analog-to-digital converter (ADC) circuit 400 that may implement various techniques of this disclosure. The ADC circuit 400 may include a sigma-delta modulator 300, such as shown in FIG. 3. In some examples, the sigma-delta modulator 300 may be a continuous-time sigma-delta (CTSD) ADC circuit, such as a first-order CTSD ADC, having an input coupled to a resistive element to receive an analog input U and generate a first digital output signal V. Although described specifically with respect to sigma-delta circuits, it should be noted that the techniques of this disclosure may be applied to any oversampled ADC circuit, including sigma-delta ADC circuits.

The ADC circuit 400 may include a sample rate converter circuit 402, such as an asynchronous sample rate converter circuit, configured to receive the first digital output signal V at a first sample rate and generate a second digital output signal X at a second sample rate.

The ADC circuit 400 may include a digital filter circuit 404 to process the second digital output signal X and generate a filtered digital output signal Y. The digital filter circuit 404 is an example of the digital filter 220 of FIG. 2 and, in some examples, may include a decimator. The digital filter 220 may include a Sinc filter or a finite impulse response (FIR) filter, for example.

The ADC circuit 400 may include an integrator 306. The integrator 306 may include an amplifier circuit 406. A first set of chop switches 408A may be coupled to an input of the amplifier circuit 406 and a second set of chop switches 408B may be coupled to an output of the amplifier circuit 406. The first set of chop switches 408A and the second set of chop switches 408B may receive and be controlled by a chop signal "chop". In configurations that utilize multiple stages, the second set of chop switches 408B may be coupled to the output of the amplifier circuit of the first stage.

This disclosure describes a chopping technique that suppresses this fold-back into the signal band and spreads the offset across the spectrum. The first set of chop switches 408A and the second set of chop switches 408B may receive and be controlled by a variable frequency chop signal "chop" to spread the offset across the signal spectrum. Spreading the offset across the signal spectrum means that there are no longer large spurious tones at a few single frequencies.

In the example shown in FIG. 4, a chop signal generating circuit 410, such as including a cascade of differentiators, may generate the variable frequency chop signal "chop". In some examples, the cascade of differentiators may be an Nth order cascade of differentiators. For example, the cascade of differentiators may be third-order cascade of differentiators, such as given by the transfer function $H(z)=[1-z^{-1}][1-z^{-2}][1-z^{-4}]$.

Figure 9:
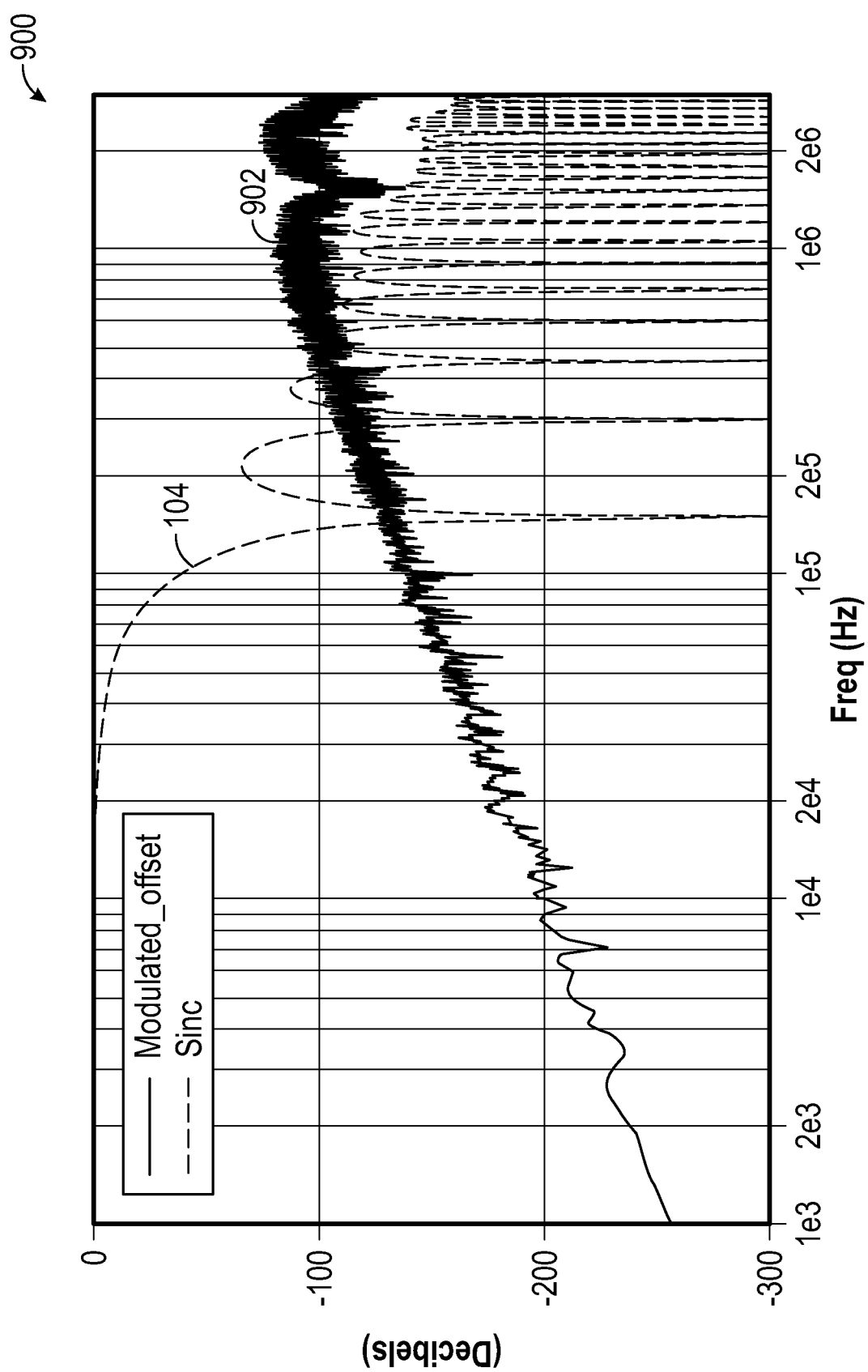
FIG. 9 is a graph of a simulation that depicts the transfer function of a higher order Sinc filter in combination with a sample rate converter of FIG. 1 overlaid with the modulated offset.

A control circuit 412 may generate a pulse of $2^N$ clock cycles, where $2^N$ is the length of the sequence and N corresponds with the order of the cascade of differentiators, that may be received by the chop signal generating circuit 410. To generate a variable frequency chop signal "chop", such as a first-order shaped chop clock signal, the control circuit 412 may define the pulse of $2^N$ clock cycles as a pattern A to +1, −1 and a pattern B to −1, +1, where +1 means that the chop switches are connecting their input to their output without swapping, and −1 means that the chop switches are connecting their input to their output by swapping them. An example of a second-order pattern A is +1, −1, −1, +1 and second-order pattern B is −1, +1, +1, −1. An example of a third-order pattern A +1, −1, −1, +1, −1, +1, +1, −1 and a third-order pattern B is −1, +1, +1, −1+1, −1, −1, +1. By using such a technique, an offset of the amplifier circuit 406 is third order shaped, such as shown in FIG. 9.

These patterns may also be obtained by sending an impulse "1" to a cascade of differentiators. In some example, it may be desirable to hard code the patterns (only a few bits), such as using a 1-bit read-only memory (ROM), and then randomly selecting the sign (notice that pattern B is just pattern A with a sign inversion).

The control circuit 412 may drive the first set of chop switches 408A and the second set of chop switches 408B according to the selected pattern. When the chop signal generating circuit 410 has applied all the values of the selected pattern to the chop switches, the control circuit 412 may randomly select either the first pattern A or the second pattern B and repeat the process.

In other examples, the control circuit 412 may randomly select the sign of the pattern, drive the first set of chop switches 408A and the second set of chop switches 408B according to the pattern multiplied by the sign. When the chop signal generating circuit 410 has applied all the values of the pattern to the chop switches, the control circuit 412 may randomly select the sign and repeat the process.

In some examples, the control circuit 412 may randomly select the sign of the pattern, randomly select a length $2^N$ of the pattern, drive the first set of chop switches 408A and the second set of chop switches 408B according to the pattern multiplied by the sign. When the chop signal generating circuit 410 has applied all the values of the pattern to the chop switches, the control circuit 412 may randomly select the sign and length $2^N$ and repeat the process.

Figure 5:
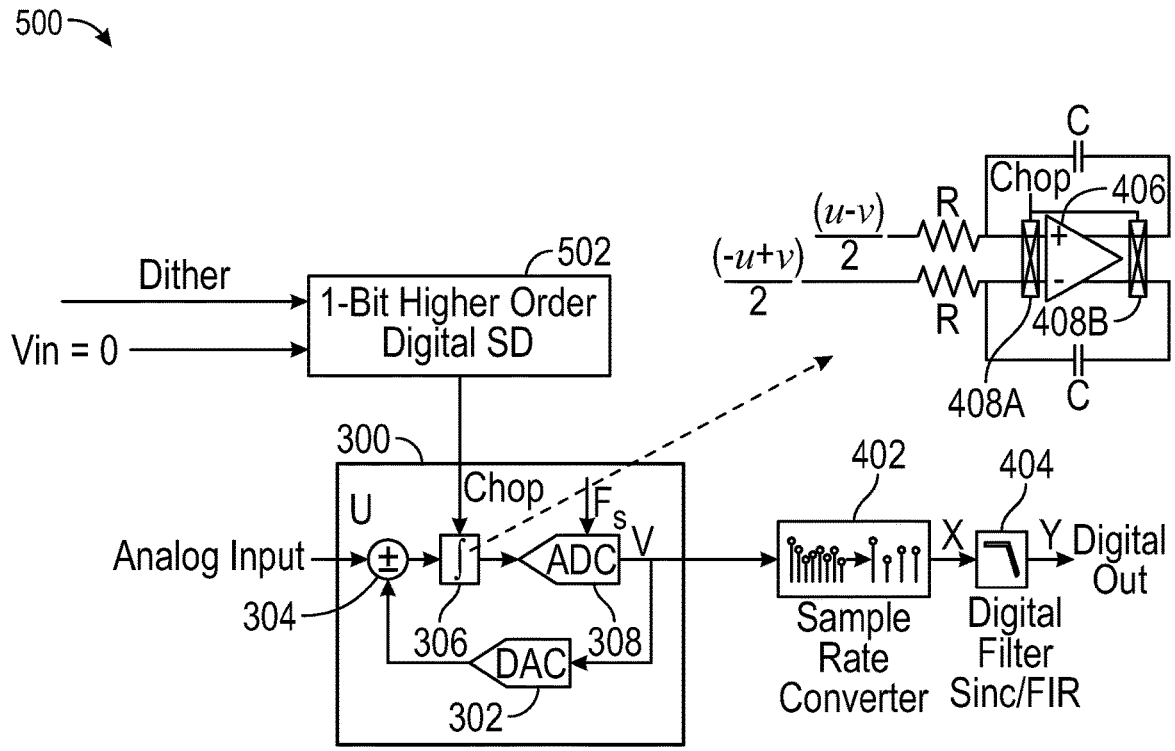
FIG. 5 is another example of an ADC circuit that may implement various techniques of this disclosure.

FIG. 5 is another example of an ADC circuit 500 that may implement various techniques of this disclosure. Many of the components of the ADC circuit 500 are similarly to those described above with respect to the ADC circuit 400 of FIG. 4 and, for purposes of conciseness, will not be described in detail again.

In the example shown in FIG. 5, a chop signal generating circuit 502, such as including a 1-bit second or higher order digital sigma-delta modulator. Sigma-delta modulators are noise-shaped and have high pass characteristics. The chop signal generating circuit 502 may receive a DC input voltage, such as 0V (the average of 1 and −1), and generate a chop signal "chop" that, on average, has the same number of ones and zeros. In some examples, a dither generator circuit may generate and apply a dither signal "dither" to the chop signal generating circuit 502 to reduce any tones that may be generated by the digital sigma-delta modulator.

Figure 6:
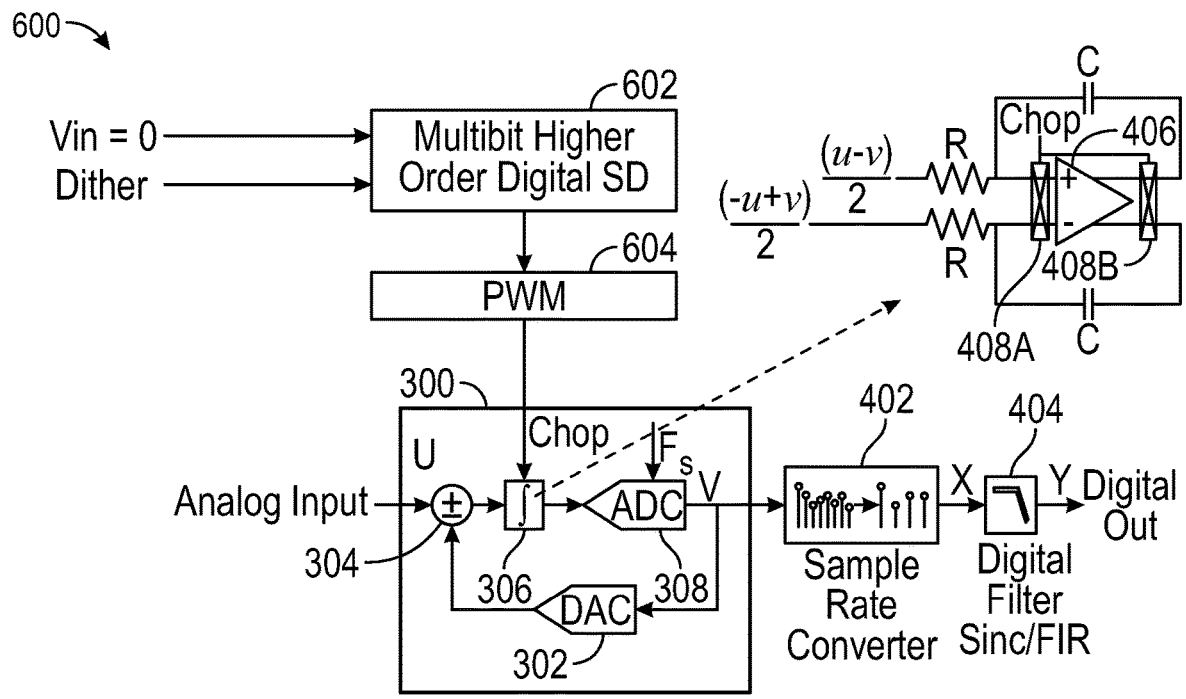
FIG. 6 is another example of an ADC circuit that may implement various techniques of this disclosure.

FIG. 6 is another example of an ADC circuit 600 that may implement various techniques of this disclosure. Many of the components of the ADC circuit 600 are similarly to those described above with respect to the ADC circuit 400 of FIG. 4 and, for purposes of conciseness, will not be described in detail again.

In the example shown in FIG. 6, a chop signal generating circuit 602, such as including a multi-bit second or higher order digital sigma-delta modulator. The chop signal generating circuit 602 may receive a DC input voltage, such as 0V (the average of 1 and −1), and generate an output signal that may be applied to a pulse width modulator (PWM) generator 604. The PWM 604 may receive the output signal of the multi-bit second or higher order digital sigma-delta modulator and re-encode that output signal to a single bit variable frequency chop signal "chop" to drive the first set of chop switches 408A and the second set of chop switches 408B.

In some examples, a dither generator circuit may generate and apply a dither signal "dither" to the chop signal generating circuit 602 to reduce any tones that may be generated by the digital sigma-delta modulator.

Figure 7:
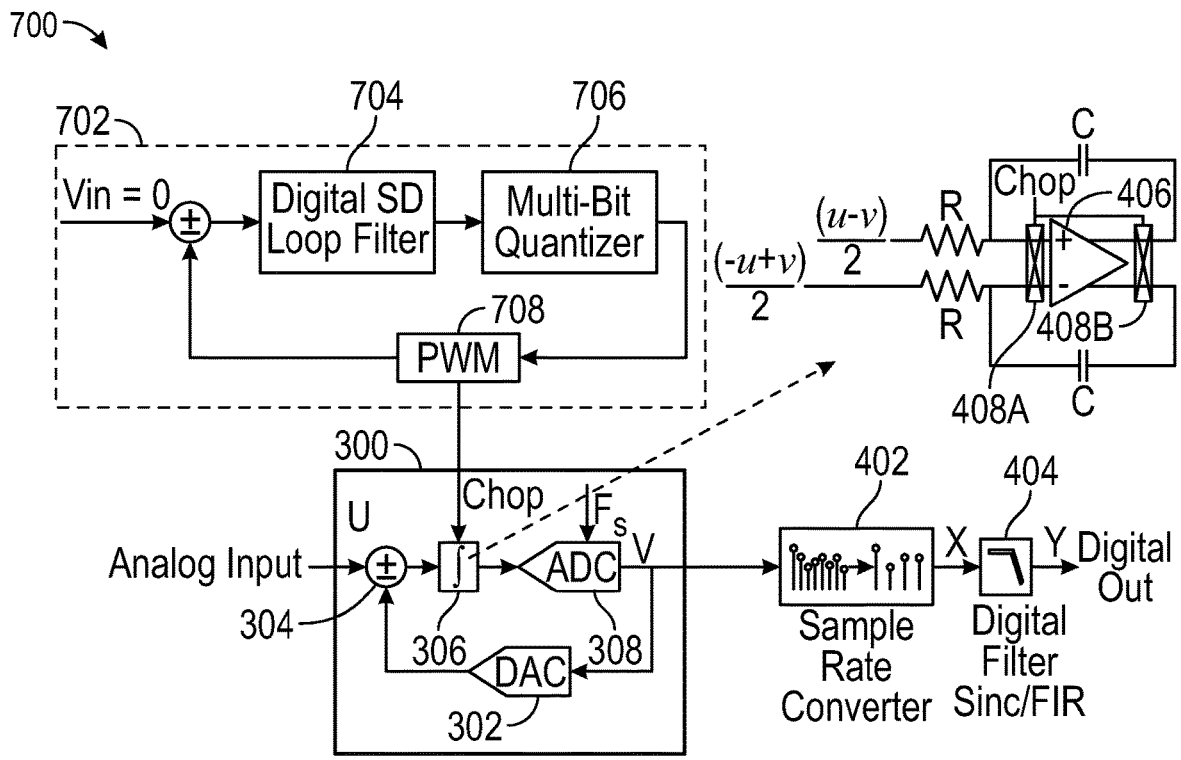
FIG. 7 is another example of an ADC circuit that may implement various techniques of this disclosure.

FIG. 7 is another example of an ADC circuit 700 that may implement various techniques of this disclosure. Many of the components of the ADC circuit 700 are similarly to those described above with respect to the ADC circuit 400 of FIG. 4 and, for purposes of conciseness, will not be described in detail again.

Like the example shown in FIG. 6, a chop signal generating circuit 702 may include a multi-bit second or higher order digital sigma-delta modulator. The multi-bit second or higher order digital sigma-delta modulator may include a digital sigma-delta loop filter 704, a multi-bit quantizer 706, and a PWM generator 708. As described above, a sigma-delta modulator is a feedback system that forms a loop. In contrast to the ADC circuit 600 of FIG. 6, the PWM generator 708 is positioned inside the loop of the sigma-delta modulator itself such that the feedback of the sigma-delta modulator is closed after the output of the PWM generator 708. This in contrast to FIG. 6 in which the output of the sigma-delta modulator is applied to the PWM generator 604 rather than the PWM generator being inside the loop of the sigma-delta modulator.

The chop signal generating circuit 702 may receive a DC input voltage, such as 0V (the average of 1 and −1), and generate a single bit variable frequency chop signal "chop" to drive the first set of chop switches 408A and the second set of chop switches 408B.

Figure 8:
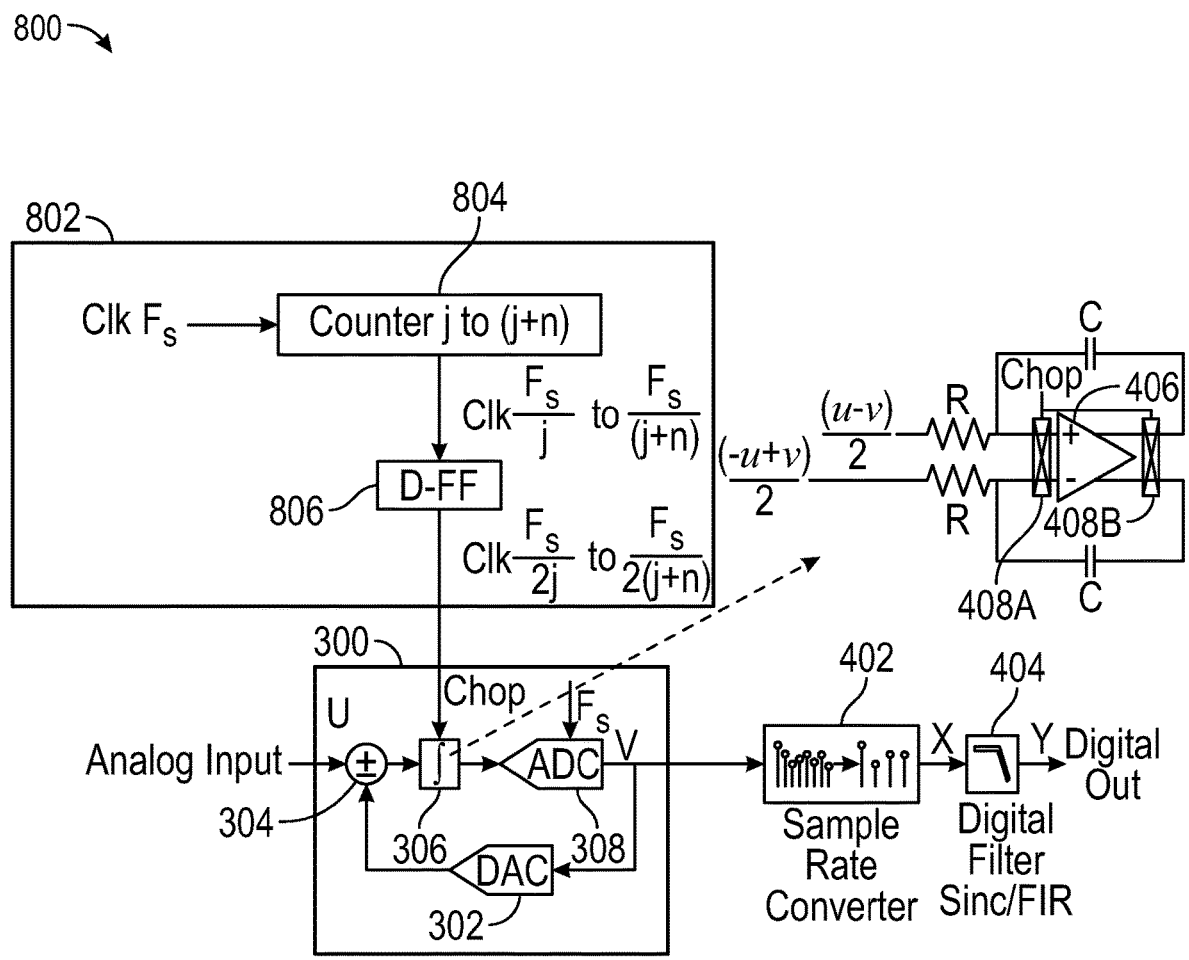
FIG. 8 is another example of an ADC circuit that may implement various techniques of this disclosure.

FIG. 8 is another example of an ADC circuit 800 that may implement various techniques of this disclosure. Many of the components of the ADC circuit 800 are similarly to those described above with respect to the ADC circuit 400 of FIG. 4 and, for purposes of conciseness, will not be described in detail again.

A chop signal generating circuit 802 that may receive a clock signal Fs, which may be the sampling frequency, and generate a variable frequency chop signal "chop" by modulating the divider ratio. For example, the chop signal generating circuit 802 may first generate a chop signal "chop" at a frequency of Fs/32 to drive the first set of chop switches 408A and the second set of chop switches 408B, then at Fs/4, then at Fs/16, and so forth.

The chop signal generating circuit 802 may include a counter circuit 804 that may randomly select a number from a counter between j and (j+n) and divide the sampling frequency Fs by that number to generate a clock signal of Fs/j to Fs/(j+n). After selecting a number, the counter circuit 804 may reset the counter. The clock signal from the counter circuit 804 may be used to generate the variable frequency chop signal. For example, the clock signal from the counter circuit 804 may be applied to a D-type flip-flop 806 configured to divide the clock signal by 2 to generate a 50% duty cycle, or a clock signal of Fs/2j to Fs/2(j+n). The clock signal from the D-type flip-flop 806 is a variable frequency chop signal "chop" that may drive the first set of chop switches 408A and the second set of chop switches 408B.

FIG. 9 is a graph of a simulation 900 that depicts the transfer function 104 of a higher order Sinc filter in combination with a sample rate converter of FIG. 1 overlaid with the modulated offset 902. Using various techniques described above, the modulated offset 902 may be accomplished by chopping with a variable frequency clock to spread the offset 902 across the signal spectrum and suppress the fold-back observed with a Sinc filter in combination with a sample rate converter. Spreading the offset across the signal spectrum means that there are no longer large spurious tones at a few single frequencies.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. An analog-to-digital converter (ADC) circuit to generate a digital output signal, the ADC circuit comprising:
   an oversampled ADC circuit having an input coupled to receive an analog input signal and generate a first digital output signal, the oversampled ADC including:
      a chop switch that receives and is controlled by a variable frequency chop signal; and
      a chop signal generating circuit to generate the variable frequency chop signal;
   a sample rate converter circuit to receive the first digital output signal at a first sample rate and generate a second digital output signal at a second sample rate; and
   a digital filter circuit including a decimator to process and decimate the second digital output signal and generate a filtered digital output signal.

2. The ADC circuit of claim 1, wherein the oversampled ADC circuit includes a sigma-delta (SD) ADC circuit, the SD ADC circuit including:
   an integrator circuit including an amplifier circuit, wherein the chop switch is coupled to an input of the amplifier circuit.

3. The ADC circuit of claim 2, wherein the chop signal generating circuit includes a cascade of differentiators.

4. The ADC circuit of claim 2, wherein the chop signal generating circuit includes a second or higher order digital sigma-delta modulator.

5. The ADC circuit of claim 4, wherein the second or higher order digital sigma-delta modulator circuit includes a one-bit second or higher order digital sigma-delta modulator.

6. The ADC circuit of claim 4, wherein the second or higher order digital sigma-delta modulator circuit includes a multi-bit second or higher order digital sigma-delta modulator.

7. The ADC circuit of claim 6, comprising:
   a pulse width modulator generator to receive an output of the multi-bit second or higher order digital sigma-delta modulator and generate the variable frequency chop signal.

8. The ADC circuit of claim 7, wherein the multi-bit second or higher order digital sigma-delta modulator is a feedback system that forms a loop, and wherein the pulse width modulator generator is positioned within the loop.

9. The ADC circuit of claim 2, wherein the chop signal generating circuit includes a counter circuit to:
   randomly select a number;
   divide a sampling frequency by the number to generate a clock signal; and
   generate the variable frequency chop signal using the clock signal.

10. A method of operating an analog-to-digital converter (ADC) circuit to generate a digital output signal, the method comprising:
   receiving an analog input signal at a summing node of a sigma-delta (SD) ADC circuit, wherein the SD ADC circuit includes an integrator circuit having an amplifier circuit and a chop switch coupled to an input of the amplifier circuit;
   receiving, using the integrator circuit, an output of the summing node;
   generating a variable frequency chop signal and operating the chop switch at the variable frequency chop signal;
   receiving, via sample rate converter circuit, a first digital output signal of the SD ADC circuit at a first sample rate and generating a second digital output signal at a second sample rate; and processing and decimating, via a digital filter circuit including a decimator, the second digital output signal and generating a filtered digital output signal.

11. The method of claim 10, wherein generating the variable frequency chop signal and operating the chop switch at the variable frequency chop signal includes:
generating the variable frequency chop signal using a cascade of differentiators.

12. The method of claim 11, wherein generating the variable frequency chop signal using the cascade of differentiators the cascade of differentiators includes:
generating the variable frequency chop signal using a third-order cascade of differentiators.

13. The method of claim 10, wherein generating the variable frequency chop signal and operating the chop switch at the variable frequency chop signal includes:
generating the variable frequency chop signal and operating the chop switch at the variable frequency chop signal using a second or higher order digital sigma-delta modulator.

14. The method of claim 13, wherein generating the variable frequency chop signal and operating the chop switch at the variable frequency chop signal using the second or higher order digital sigma-delta modulator includes:
generating the variable frequency chop signal and operating the chop switch at the variable frequency chop signal using a one-bit second or higher order digital sigma-delta modulator.

15. The method of claim 13, wherein generating the variable frequency chop signal and operating the chop switch at the variable frequency chop signal using the second or higher order digital sigma-delta modulator includes:
generating the variable frequency chop signal and operating the chop switch at the variable frequency chop signal using a multi-bit second or higher order digital sigma-delta modulator.

16. The method of claim 15, comprising:
receiving, using a pulse width modulator generator, an output of the multi-bit second or higher order digital sigma-delta modulator and generating the variable frequency chop signal.

17. The method of claim 10, wherein generating a variable frequency chop signal and operating the chop switch at the variable frequency chop signal includes:
randomly selecting a number;
dividing a sampling frequency by the number to generate a clock signal; and
generating the variable frequency chop signal using the clock signal.

18. An analog-to-digital converter (ADC) circuit to generate a digital output signal, the ADC circuit comprising:
a sigma-delta (SD) ADC circuit having an input coupled to receive an analog input signal and generate a first digital output signal, the SD ADC including:
an integrator circuit including an amplifier circuit and a chop switch, the chop switch coupled to an input of the amplifier circuit, wherein the chop switch receives and is controlled by a variable frequency chop signal; and
means for generating the variable frequency chop signal;
a sample rate converter circuit to receive the first digital output signal at a first sample rate and generate a second digital output signal at a second sample rate; and
a digital filter circuit including a decimator to process and decimate a representation of the digital output signal and generate a filtered digital output signal.

19. The ADC circuit of claim 18, comprising:
a sample rate converter circuit to receive the digital output signal at a first sample rate and generate the representation of the digital output signal at a second sample rate.

20. The ADC circuit of claim 18, wherein the means for generating the variable frequency chop signal includes a second or higher order digital sigma-delta modulator.

* * * * *